United States Patent [19]
Arima et al.

[11] Patent Number: 5,354,702
[45] Date of Patent: Oct. 11, 1994

[54] ELECTRICAL ERASABLE AND PROGRAMMABLE READ-ONLY MEMORY AND MANUFACTURING METHOD THEREFOR

[75] Inventors: Eiichi Arima; Akira Nishimoto; Shinichi Jintate; Kazuo Sudo; Kazutoshi Oku, all of Hyogo, Japan

[73] Assignee: Mitsubishi Denki Kabushiki Kaisha, Tokyo, Japan

[21] Appl. No.: 84,092

[22] Filed: Jul. 1, 1993

Related U.S. Application Data

[62] Division of Ser. No. 241,887, Sep. 8, 1988, Pat. No. 5,252,847.

[30] Foreign Application Priority Data

Sep. 9, 1987 [JP] Japan .................. 62-225910

[51] Int. Cl.$^5$ ............................................. H01L 21/70
[52] U.S. Cl. ........................................ 437/52; 437/43; 437/48; 437/228; 437/233; 437/235
[58] Field of Search ................ 437/43, 48, 52, 228, 437/233, 235

[56] References Cited

U.S. PATENT DOCUMENTS

| | | | |
|---|---|---|---|
| 4,302,766 | 11/1981 | Guterman | 437/43 |
| 4,612,212 | 9/1986 | Masuoka | 437/43 |
| 4,988,635 | 1/1991 | Ajika et al. | 437/43 |

Primary Examiner—Tom Thomas
Attorney, Agent, or Firm—Lowe, Price, LeBlanc & Becker

[57] ABSTRACT

A method for manufacturing an EEPROM comprises the step of using raw gas containing an organic compound having a molecular weight of more than 44, such as ethyl acetate and tetrahydrofuran when a first polysilicon layer serving as a select gate electrode and a second polysilicon layer serving as a floating gate electrode are deposited by a CVD process. The above described step allows a voltage at the time of tunneling electrons to be decreased.

17 Claims, 5 Drawing Sheets

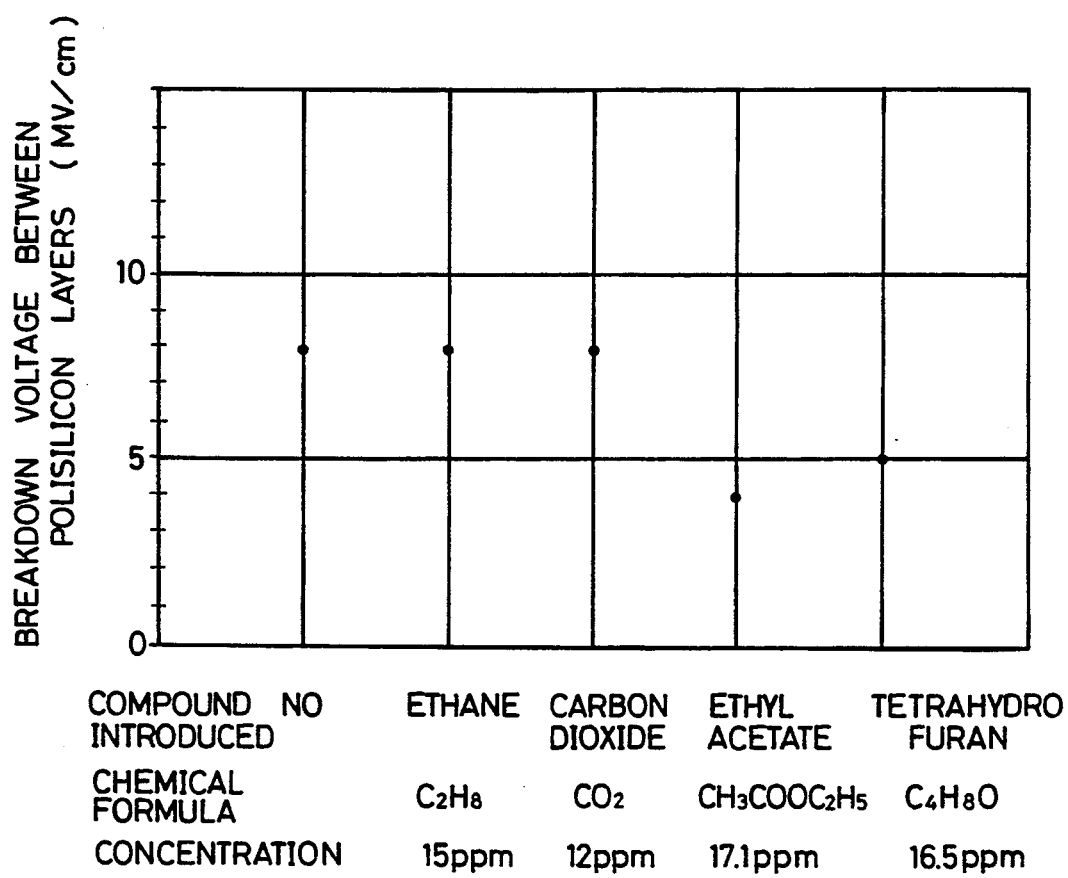

ELECTRICAL ERASABLE AND PROGRAMMABLE READ-ONLY MEMORY AND MANUFACTURING METHOD THEREFOR

This application is a division of patent application Ser. No. 07/241,887, filed Sep. 8, 1988, now U.S. Pat. No. 5,252,847.

BACKGROUND OF THE INVENTION

1. Field of the Invention

The present invention relates generally to an electrical erasable and programmable read-only memory (referred to as EEPROM hereinafter) and a manufacturing method therefor, particularly to reducing the programming voltages therefor.

2. Description of the Prior Art

In the description of the prior art, the U.S. Pat. No. 4,099,196 issued Jul. 4, 1978, entitled "Triple Layer Polysilicon Cell", assigned to Intel Corporation is incorporated by reference.

FIG. 1 is a cross sectional view showing a single cell of a conventional EEPROM having a triple gate structure which is disclosed in the above mentioned U.S. Pat. No. 4,099,196.

The EEPROM having a triple gate structure comprises a first polysilicon (polycrystalline silicon) gate electrode 3 formed on a silicon substrate 1 through a first gate oxide film 2 for writing information charge, a second polysilicon gate electrode 5 formed on the first polysilicon gate electrode 3 through a first polysilicon gate oxide film 4 and serving as a floating gate electrode, a third polysilicon gate electrode 7 formed on the second polysilicon gate electrode 5 through a second polysilicon gate oxide film 6 to overlap with at least a portion of the second polysilicon gate electrode 5 for controlling writing and erasing of the information charge, and a fourth polysilicon gate electrode 8 for erasing the information charge.

Operation is now described. When data is written, the EEPROM having a triple gate structure applies a voltage of approximately 25 V to the third polysilicon gate electrode 7 and the fourth polysilicon gate electrode 8, and the first polysilicon gate electrode 3 is grounded. As a result, electrons are injected from the first polysilicon gate electrode 3 to the second polysilicon gate electrode 5 by tunneling. In addition, when data is erased, the first polysilicon gate electrode 3 and the third polysilicon gate electrode 7 are grounded, and a voltage of approximately 25 V is applied to the fourth polysilicon gate electrode 8. As a result, electrons deposited on the second polysilicon gate electrode 5 are injected to the fourth polysilicon gate electrode 8 by tunneling. The oxide films 4 and 6 on the first polysilicon gate electrode 3 and the second polysilicon gate electrode 5 are approximately 1000Å. Since electrons tunnel through the oxide films 4 and 6 at approximately 25 V, the EEPROM having a triple gate structure is formed such that a portion from which information charge is emitted, of the polysilicon layers 3 and 5 serving as electrodes, has a rough surface. The rough surface allows tunneling of electrons even at a relatively low voltage.

Conventionally, the following approaches have been employed so that the surface of the portion from which information charge is emitted, of the first polysilicon gate electrode 3 and the second polysilicon gate electrode 5 easily becomes rough.

(1) A first polysilicon gate oxide film is formed by thermal oxidation at a low temperature. (For the fact that the surface of polysilicon becomes rough more easily by thermal oxidation at a low temperature, see an article by R. M. Anderson et al., entitled "Evidence for surface asperity mechanism of conductivity in oxide grown on polycrystalline silicon", J. of Applied Physics, Vol. 48, No. 11, November, 1977.)

(2) The concentration of implanting conductive impurities into polysilicon serving as a first polysilicon gate and a second polysilicon gate is decreased.

Description is now made on a method for manufacturing the EEPROM. FIGS. 2A to 2E are diagrams showing the sequential steps of the manufacturing method for the conventional EEPROM.

A p type silicon substrate 1 is prepared (FIG. 2A). A first gate oxide film 2 is then formed on the silicon substrate 1 (FIG. 2B). A polysilicon layer 8 with the concentration of conductive impurities decreased is then formed on the first gate oxide film 2 to be a first polysilicon layer 3 (FIG. 2C). A first polysilicon gate oxide film 4 is formed in the upper and side portions of the first polysilicon layer 3 by thermal oxidation, and a second polysilicon gate electrode 5 with the impurity concentration decreased is formed thereon (FIG. 2D). A second polysilicon gate oxide film 6 is formed in the upper and side portions of the second polysilicon gate electrode 5 by thermal oxidation, and a third polysilicon gate electrode 7 and a fourth polysilicon gate electrode 8 are formed thereon.

The manufacturing method for the conventional EEPROM having a triple gate structure comprises the steps of, for example, decreasing the concentration of impurities contained in polysilicon and decreasing the thermal oxidation temperature of a gate oxide film so that the first polysilicon gate electrode and the second polysilicon gate electrode have rough surfaces. However, it is difficult to make uniform the concentration of impurities contained in polysilicon within the surface of the silicon substrate. Therefore, the rough surfaces of the polysilicon cannot be made uniform. Thus, electric characteristics are not kept constant, yield of the EEPROM is decreased and the reliability is decreased.

SUMMARY OF THE INVENTION

An object of the present invention is to provide an improved EEPROM and a manufacturing method therefor.

Another object of the present invention is to reduce the programming voltage of an EEPROM.

Another object of the present invention is to provide a method for manufacturing a semiconductor memory device in which electrons can tunnel through an oxide film of approximately 1000Å at a low voltage, irrespective of the concentration of impurities in polysilicon and the thermal oxidation temperature on polysilicon.

The semiconductor memory device according to the present invention comprises a semiconductor substrate having a major surface and a predetermined impurity concentration of a particular conductivity type, an insulating layer formed on the major surface of said semiconductor substrate, a first gate electrode comprising polysilicon containing an organic compound having a molecular weight of more than 44 formed on said insulating layer, and a second gate electrode comprising polysilicon containing an organic compound having a molecular weight of more than 44 and covering at lease a part of said first gate electrode while being insulated from said first gate electrode.

In the manufacturing method for the semiconductor memory device according to the present invention, when a polysilicon gate having a low breakdown voltage such as a first polysilicon gate electrode and a second polysilicon gate electrode is formed, an organic compound having a molecular weight of more than 44 is contained in raw gas for growing polysilicon, such as silane gas.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram showing the relation between a compound introduced into silane gas and the breakdown voltage between polysilicon;

DESCRIPTION OF THE PREFERRED EMBODIMENTS

Figure 1:
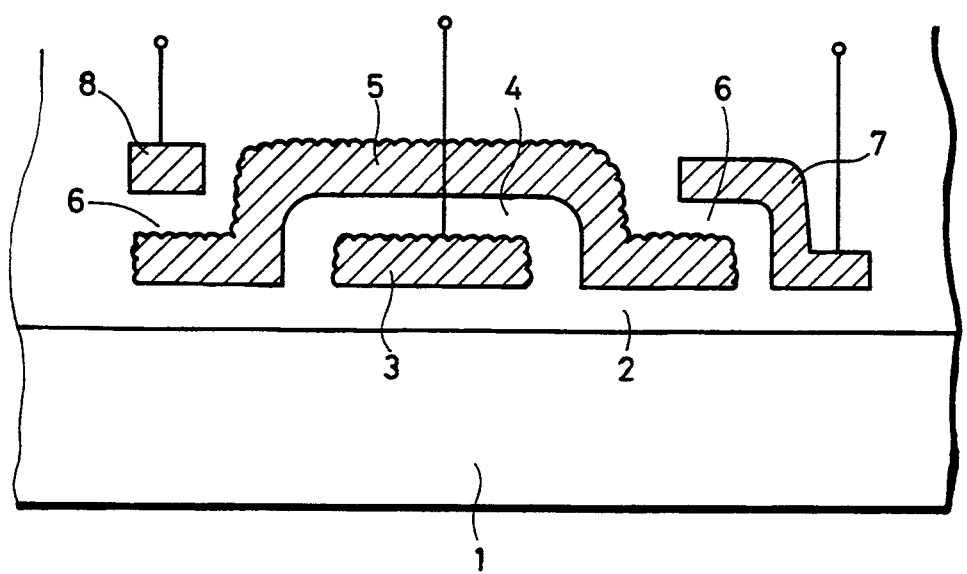
FIG. 1 is a diagram showing a conventional EEPROM having a triple gate structure.
Figure 2A:
FIGS. 2A to 2E are diagrams showing processes in a manufacturing method for the conventional EEPROM having a triple gate structure.
Figure 2B:
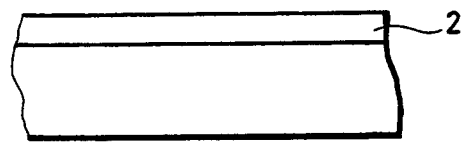
Figure 2C:
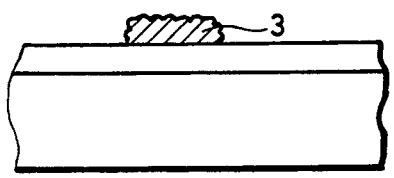
Figure 2D:
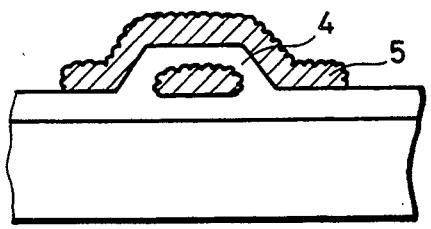
Figure 2E:
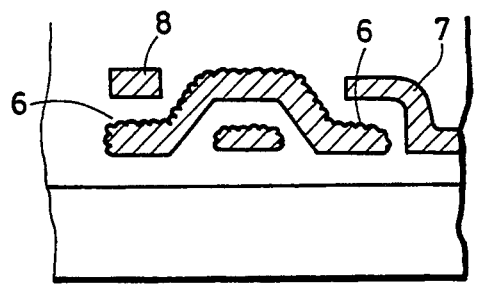

An organic compound having a molecular weight of more than 44 in raw gas reduces the voltage which causes electrons to tunnel through an oxide film formed between polysilicon gate electrodes by thermal oxidation.

Referring now to FIG. 3, the above mentioned phenomenon is described. FIG. 3 is a graph, axis of abscissa of which represents a compound introduced into silane gas and axis of ordinate of which represents the breakdown voltage between polysilicon layers with the oxide film interposed therebetween. The graph shows the relation between a compound introduced into silane gas and the breakdown voltage between the polysilicon layers.

In this case, the condition of forming polysilicon is as follows: the temperature is 600° to 650° C., the thickness of an insulating layer between polysilicon is 900 to 1000Å, the surface is not rough and the concentrations of compounds contained in silane gas are described in FIG. 3.

In addition, the breakdown voltage is represented by the voltage generated when current of 0.5 μA flows between polysilicon.

From FIG. 3, the following is seen.

(1) When foreign matter is not contained in silane gas, the breakdown voltage is about 8 MV/cm. When 17.1 ppm of ethyl acetate (molecular weight 88) is contained, the breakdown voltage is reduced to about 4 MV/cm. In addition, when 16.5 ppm of tetrahydrofuran (molecular weight 72 ppm) is contained, the breakdown voltage is reduced to about 5 MV/cm.

(2) When carbon dioxide (molecular weight 44) and ethane (molecular weight 30) are contained, the effect is not recognized.

(3) In the foregoing, when an organic compound having a molecular weight of more than 44 is contained, the breakdown voltage between polysilicon can be reduced.

Referring now to FIGS. 4 and 5A to 5E, description is made an embodiment of the present invention.

Figure 4:
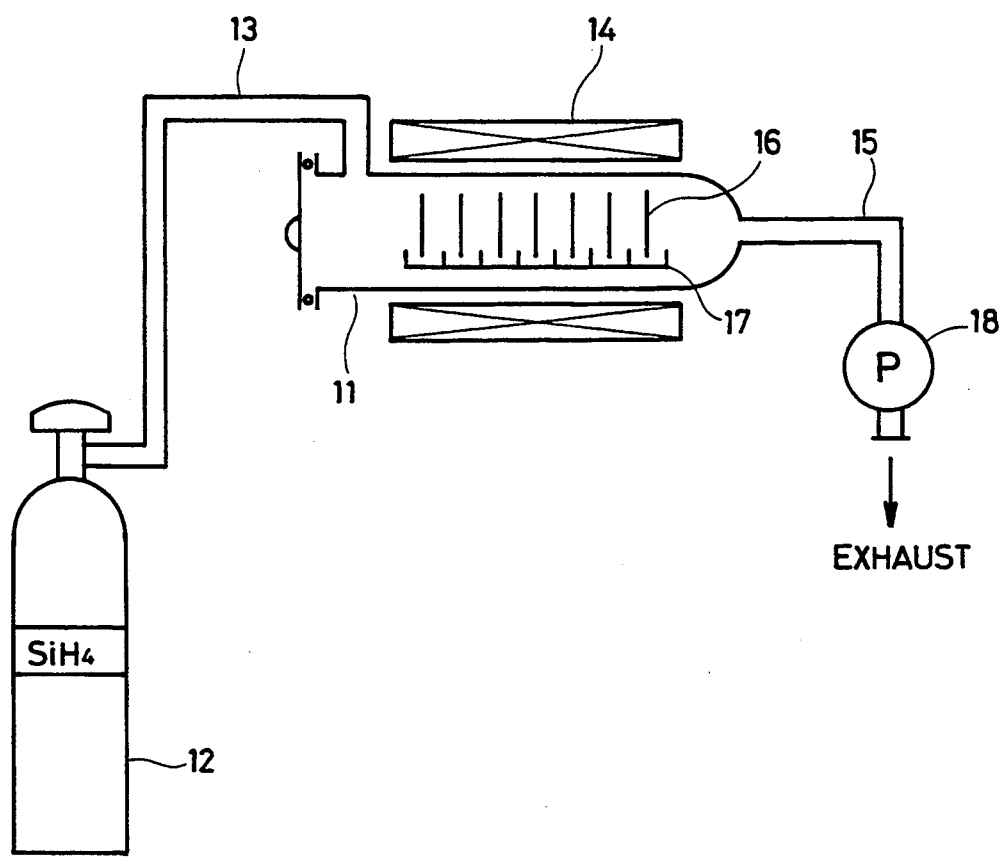
FIG. 4 is a schematic illustration of a CVD equipment used to deposit polysilicon on a wafer according to an embodiment of the present invention.

FIG. 4 is a schematic illustration of a CVD equipment used for implementing a manufacturing method for an EEPROM according to the present invention. The CVD equipment comprises a reaction tube 11, a gas piping 13 for supplying raw gas 12 to the reaction tube 11, a heater 14 arranged around the reaction tube 11, a vacuum pump 18 for exhausting air in the reaction tube 11, and an exhaust piping 15. Wafers 16 having polysilicon layers deposited thereon are mounted on a board 17 and held in the reaction tube 11.

The condition of depositing polysilicon for implementing the present invention is as follows: the degree of vacuum is 0.1 to 0.5 Torr. The temperature is 600° to 650° C. The raw gas is silane gas and the flow rate thereof is 100 to 200 cc/min, preferably, 150 cc/min.

Figure 5A:
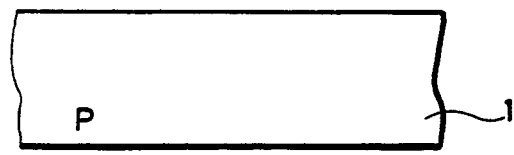
FIGS. 5A to 5E are cross sectional views showing processes of a manufacturing method for a semiconductor memory device according to an embodiment of the present invention.
Figure 5B:
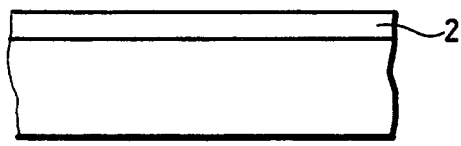
Figure 5C:
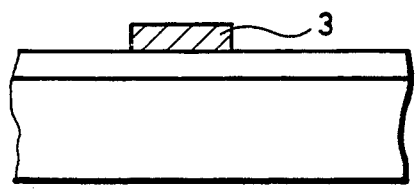
Figure 5D:
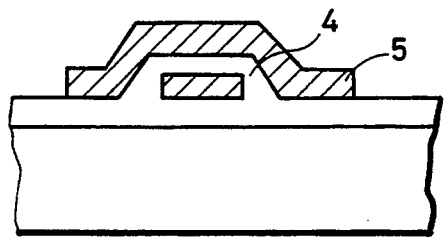
Figure 5E:
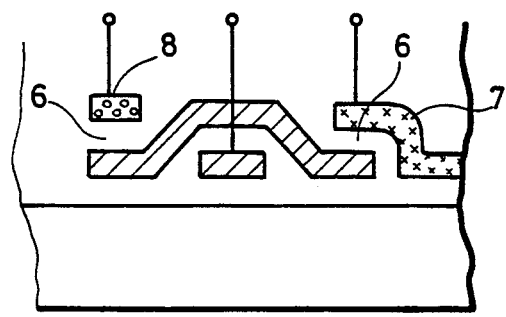

FIG. 5A to 5E are diagrams showing the sequential steps of a method for manufacturing a semiconductor memory device according to the present invention. A first gate oxide film 2 is formed on a silicon substrate 1 by thermal oxidation (FIGS. 5A and 5B). A first polysilicon layer serving as a write and select gate electrode is then deposited by chemical vapor deposition (FIG. 5C). When the first polysilicon layer is deposited, a compound having a molecular weight of more than 44 comprising oxygen, hydrogen or carbon, such as ethyl acetate and tetrahydrofuran is introduced into raw gas such as silane gas. After conductive impurities are added to the polysilicon layer to form a first polysilicon gate electrode 3, a first polysilicon gate oxide film 4 is formed by thermal oxidation. Thereafter, a second polysilicon gate electrode 5 serving as a floating gate electrode is formed (FIG. 5D). On this occasion, a compound having a molecular weight of more than 44 comprising oxygen, hydrogen or carbon, such as ethyl acetate and tetrahydrofuran is also introduced into raw gas such as silane gas, so that a polysilicon layer is deposited by chemical vapor deposition. Conductive impurities are added to the polysilicon layer, so that a second polysilicon gate electrode 5 is formed by photolithography and etching. A second polysilicon gate oxide film 6 is formed thereon again by thermal oxidation. A third polysilicon gate electrode 7 and a fourth polysilicon gate electrode 8 are deposited by chemical vapor deposition, so that a control gate electrode and an erase gate electrode are formed (FIG. 5E).

When the first polysilicon layer and the second polysilicon layer are deposited, a compound having a molecular weight of more than 44 comprising hydrogen, oxygen or carbon is introduced into raw gas such as silane gas to form the first and second polysilicon gate electrodes 3 and 5. The first and second polysilicon gate oxide films 4 and 6 are formed thereon by thermal oxidation. As a result, the voltage which causes tunneling of electrons stored in the first and second polysilicon gate electrodes 3 and 5 is reduced. Therefore, electrons can be injected from the first polysilicon gate electrode 3 to the second polysilicon gate electrode 5 or from the second polysilicon gate electrode 5 to the third polysilicon gate electrode 7 at a voltage of approximately 25 V even if the thicknesses of the polysilicon oxide films between silicon gate electrodes are about 1000Å. In addition, uniform electric characteristics are obtained using this method, irrespective of variation in the concentration of impurities in polysilicon.

In addition to the above described embodiment, the present invention can be applied to a nonvolatile semiconductor memory device in which n or p type source and drain are formed on the major surface of a silicon substrate, so that electrons are injected into a floating gate by hot electrons produced by avalanche breakdown in the silicon substrate and electrons are emitted from the floating gate by applying electric field between the first polysilicon gate electrode and the control gate electrode (which is disclosed in U.S. Pat. No. 4,302,766 issued Nov. 24, 1981, entitled "Self-Limiting Erasable Memory Cell with Triple Level Polysilicon", assigned to T.I.).

Furthermore, the present invention is effective for all of semiconductor devices which require to reduce the breakdown voltage of an oxide film on a polysilicon gate.

As described in the foregoing, according to the present invention, when a polysilicon layer is formed, an organic compound having a molecular weight of more than 44 is introduced, so that the voltage at the time of injecting electrons into the oxide film formed on the polysilicon layer is reduced. Therefore, a method for manufacturing a semiconductor memory device can be obtained which permits tunneling of electrons through an oxide film of approximately 1000Å at a low voltage, irrespective of the concentration of impurities in polysilicon and the thermal oxidation temperature on polysilicon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor memory device comprising the steps of:
   preparing a semiconductor substrate having a major surface and a conductive impurity concentration,
   forming an insulating layer on the major surface of said semiconductor substrate,
   forming on said insulating layer a first polysilicon gate electrode containing an organic compound selected from the group consisting of ethyl acetate and tetrahydrofuran, and
   forming a second polysilicon gate electrode containing an organic compound selected from the group consisting of ethyl acetate and tetrahydrofuran and covering at least a part of said first polysilicon gate electrode while being insulated from said first polysilicon gate electrode.

2. A method for manufacturing a semiconductor memory device according to claim 1, further comprising the steps of:
   forming a third gate electrode comprising polysilicon and covering at least a part of said second gate electrode while being insulated from said first gate electrode and said second gate electrode, and
   forming a fourth gate electrode comprising polysilicon and covering at least a part of said second gate electrode while being insulated from said first gate electrode, said second gate electrode and said third gate electrode.

3. A method for manufacturing a semiconductor memory device according to claim 1, wherein the step of forming said first and second polysilicon gate electrodes using polysilicon containing said organic compound comprises the step of introducing the organic compound into a source gas for forming polysilicon.

4. A method for manufacturing a semiconductor memory device according to claim 3, wherein the step of forming polysilicon using said source gas comprises the step of forming polysilicon using a CVD equipment.

5. A method for manufacturing a semiconductor memory device according to claim 4, wherein said CVD equipment comprises a reaction tube for holding said semiconductor substrate, a gas piping for supplying said source gas to said reaction tube, a vacuum pump for exhausting gas in said reaction tube, an exhaust piping connecting said vacuum pump and said reaction tube, and a heater provided around said reaction tube for heating said reaction tube, the step of forming polysilicon using said CVD equipment comprising the steps of:
   evacuating the inside of said reaction tube,
   heating the inside of said reaction tube by said heater, and
   allowing said source gas to flow into said reaction tube.

6. A method for manufacturing a semiconductor memory device according to claim 5, wherein the degree of vacuum inside of said reaction tube comprises 0.1 to 0.5 Torr.

7. A method for manufacturing a semiconductor memory device according to claim 6, wherein the temperature inside of said reaction tube comprises 600° to 650° C.

8. A method for manufacturing a semiconductor memory device according to claim 6, wherein said source gas comprises silane gas and said source gas flows into said reaction tube at a flow rate of 100 to 200 cc/min.

9. A method for manufacturing a semiconductor memory device according to claim 3, wherein said first gate electrode includes a write and select gate electrode, said second gate electrode includes a floating gate electrode, said third gate electrode includes a control electrode and said fourth gate electrode includes an erase electrode.

10. A method for manufacturing a semiconductor memory device according to claim 9, wherein said semiconductor memory device includes a nonvolatile semiconductor memory device.

11. A method for manufacturing a semiconductor memory device having a floating polysilicon gate electrode comprising the steps of:
   preparing a semiconductor substrate having a major surface and a conductive impurity concentration,
   forming an insulating layer on the major surface of said semiconductor substrate,
   forming on said insulating layer a write and select polysilicon gate electrode containing an organic compound selected from the group consisting of ethyl acetate and tetrahydrofuran, and
   forming a floating polysilicon gate electrode containing an organic compound selected from the group consisting of ethyl acetate and tetrahydrofuran and covering at least a part of said write and select polysilicon gate electrode, forming a control polysilicon gate electrode and covering at least a part of said floating polysilicon gate electrode while being insulated from said write and select polysilicon gate electrode and said floating polysilicon gate electrode, and forming an erase polysilicon gate electrode and covering at least a part of said floating polysilicon gate electrode while being insulated from said write and select polysilicon gate electrode, said floating polysilicon gate electrode and said control polysilicon gate electrode.

12. A method for manufacturing a semiconductor memory device according to claim 11, wherein the step of forming the write and select polysilicon gate electrode and the floating polysilicon gate electrode containing said organic compound comprises the step of containing the organic compound having a molecular weight of more than 44 in the source gas forming polysilicon.

13. A method for manufacturing a semiconductor memory device according to claim 12, wherein the step of forming polysilicon using said source gas comprises the step of forming polysilicon using a CVD equipment.

14. A method for manufacturing a semiconductor memory according to claim 13, wherein said CVD equipment comprises a reaction tube for holding said semiconductor substrate, a gas piping for supplying said source gas to said reaction tube, a vacuum pump for exhausting gas in said reaction tube, an exhaust piping connecting said vacuum pump and said reaction tube, and a heater provided around said reaction tube for heating said reaction tube, the step of forming polysilicon using said CVD equipment comprising the steps of:

evacuating the inside of said reaction tube, heating the inside of said reaction tube by said heater, and allowing said source gas to flow into said reaction tube.

15. A method for manufacturing a semiconductor memory device according to claim 14, wherein the degree of vacuum inside of said reaction tube comprises 0.1 to 0.5 Torr.

16. A method for manufacturing a semiconductor memory device according to claim 15, wherein the temperature inside of said reaction tube comprises 600° to 650° C.

17. A method for manufacturing a semiconductor memory device according to claim 16, wherein said source gas comprises silane gas and said source gas flow into said reaction tube at a flow rate of 100 to 200 cc/min.

* * * * *